(12) United States Patent
Xu et al.

(10) Patent No.: US 12,255,185 B2
(45) Date of Patent: Mar. 18, 2025

(54) SYSTEMS AND METHODS FOR MULTI-COLOR LED WITH STACKED BONDING STRUCTURES

(71) Applicant: Jade Bird Display (Shanghai) Limited, Shanghai (CN)

(72) Inventors: Qunchao Xu, Shanghai (CN); Qiming Li, Albuquerque, NM (US)

(73) Assignee: JADE BIRD DISPLAY (SHANGHAI) LIMITED, Shanghai (CN)

(*) Notice: Subject to any disclaimer, the term of this patent is extended or adjusted under 35 U.S.C. 154(b) by 365 days.

(21) Appl. No.: 17/217,484

(22) Filed: Mar. 30, 2021

(65) Prior Publication Data

US 2021/0305220 A1    Sep. 30, 2021

Related U.S. Application Data

(60) Provisional application No. 63/002,092, filed on Mar. 30, 2020.

(51) Int. Cl.
  *H01L 25/075*  (2006.01)
  *H01L 33/00*  (2010.01)
  (Continued)

(52) U.S. Cl.
  CPC ...... *H01L 25/0753* (2013.01); *H01L 33/0093* (2020.05); *H01L 33/08* (2013.01);
  (Continued)

(58) Field of Classification Search
  CPC ....... H01L 33/08; H01L 33/387; H01L 33/62; H01L 27/156; H01L 25/0753
  See application file for complete search history.

(56) References Cited

U.S. PATENT DOCUMENTS

2017/0025567 A1*  1/2017  Lu ..................... H01L 27/153
2018/0122836 A1*  5/2018  Kang ................... H01L 33/60
(Continued)

OTHER PUBLICATIONS

The International Searching Authority, the International Search Report and the Written Opinion, PCT/US2021/024873, Hong Kong Beida Jade Bird Display Limited, Aug. 12, 2021, 11 pages.
(Continued)

*Primary Examiner* — Lauren R Bell
(74) *Attorney, Agent, or Firm* — Morgan, Lewis & Bockius LLP

(57) ABSTRACT

A single pixel multi-color LED device includes two or more LED structures for emitting a range of colors. The two or more LED structures are horizontally formed as sub-pixels to combine light. In some embodiments, two or more light emitting layers are formed on a substrate with integrated circuits and the two or more light emitting layers are bonded together with bonding layers. In some embodiments, the two or more LED structures are formed by utilizing a respective top light emitting layer of the respective LED structure and by removing extra top light emitting layer(s) with the respective LED structure. In some embodiments, the up and down orientation of the P-type region and the N-type region within the first light emitting layer is different from the up and down orientation of the P-type region and the N-type region within the second light emitting layer.

13 Claims, 8 Drawing Sheets

(51) Int. Cl.
*H01L 33/08* (2010.01)
*H01L 33/38* (2010.01)
*H01L 33/62* (2010.01)

(52) U.S. Cl.
CPC ............ *H01L 33/387* (2013.01); *H01L 33/62* (2013.01); *H01L 2933/0066* (2013.01)

(56) References Cited

U.S. PATENT DOCUMENTS

| | | |
|---|---|---|
| 2018/0175268 A1* | 6/2018 | Moon ..................... H01L 27/15 |
| 2019/0198709 A1 | 6/2019 | Wildeson et al. |
| 2019/0206927 A1 | 7/2019 | Lee et al. |
| 2019/0319020 A1 | 10/2019 | Pan |
| 2020/0058824 A1 | 2/2020 | Jang et al. |
| 2021/0175280 A1* | 6/2021 | Chae ....................... H01L 33/44 |
| 2021/0193730 A1* | 6/2021 | Armitage ................ H01L 33/38 |

OTHER PUBLICATIONS

Extended European Search Report issued in European Patent Application No. 21780070.5 dated Mar. 25, 2024.

* cited by examiner

SYSTEMS AND METHODS FOR MULTI-COLOR LED WITH STACKED BONDING STRUCTURES

RELATED APPLICATION

This application claims priority to U.S. Provisional Patent Application No. 63/002,092, filed Mar. 30, 2020, entitled "SYSTEMS AND METHODS FOR MULTI-COLOR LED WITH STACKED BONDING STRUCTURES," which is hereby incorporated by reference.

TECHNICAL FIELD

The present disclosure relates generally to light-emitting diode (LED) display devices, and more particularly, to systems and fabricating methods for LED semiconductor devices that emit different colors with micro-meter scale pixel size and bonded layers.

BACKGROUND

With the development of Mini LED and Micro LED technology in recent years, consumer devices and applications such as augmented reality (AR), projection, heads-up display (HUD), mobile device displays, wearable device displays, and automotive displays, require LED panels with improved resolution and high-yield fabrication processes. For example, an AR display integrated within a goggle and positioned close to a wearer's eyes can have a dimension of a fingernail while still demanding an HD definition (1280× 720 pixels) or higher. Many electronic devices require certain pixel size, distance between adjacent pixels, brightness, and viewing angle for the LED panels.

Also, active matrix liquid-crystal displays (LCD) and organic light emitting diode (OLED) displays combined with thin-film transistor (TFT) technology are becoming increasingly popular in today's commercial electronic devices. These displays are widely used in laptop personal computers, smartphones and personal digital assistants. Millions of pixels together create an image on a display. The TFTs act as switches to individually turn each pixel on and off, rendering the pixel light or dark, which allows for convenient and efficient control of each pixel and of the entire display.

However, conventional LCD displays suffer from low light efficiency, causing high power consumption and limited battery operation time. While active-matrix organic light-emitting diode (AMOLED) display panels generally consume less power than LCD panels, an AMOLED display panel can still be the dominant power consumer in battery-operated devices. To extend battery life, it is desirable to reduce the power consumption of the display panel.

Conventional inorganic semiconductor light emitting diodes (LED) have demonstrated superior light efficiency, which makes active matrix LED displays more desirable for battery operated electronics. Arrays of driver circuitry and light-emitting diodes (LEDs) are used to control millions of pixels, rendering images on the display. Both single-color display panels and full-color display panels can be manufactured according to a variety of fabrication methods.

However, the integration of thousands or even millions of micro LEDs with pixel driver circuit array is quite challenging. Various fabrication methods have been proposed. In one approach, control circuitry is fabricated on one substrate and LEDs are fabricated on a separate substrate. The LEDs are transferred to an intermediate substrate and the original substrate is removed. Then the LEDs on the intermediate substrate are picked and placed one or a few at a time onto the substrate with the control circuitry. However, this fabrication process is inefficient, costly and not reliable. In addition, there are no existing manufacturing tools for mass transferring micro LEDs. Therefore, new tools must be developed.

In another approach, the entire LED array with its original substrate is aligned and bonded to the control circuitry using metal bonding. The substrate on which the LEDs are fabricated remains in the final product, which may cause light cross-talk. Additionally, the thermal mismatch between the two different substrates generates stress at the bonding interface, which can cause reliability issues. Furthermore, multi-color display panels typically require more LEDs and different color LEDs grown on different substrate materials, compared with single-color display panels, thus making the traditional manufacturing process even more complicated and inefficient.

As such, it would be desirable to provide an LED structure for display panels that addresses one or more of the above-mentioned drawbacks, amongst others.

SUMMARY

There is a need for improved multi-color LED designs that improve upon, and help to address one or more of the shortcomings of conventional display systems, such as those described above. In particular, there is a need for an LED device structure that can improve the fabrication efficiency, reliability, and resolution at the same time while efficiently maintaining low power consumption.

Display panels display various colors using a mixture of colors such as red, green and blue. Each of the pixels of the display panel includes sub-pixels such as red, green and blue sub-pixels. The color of a particular pixel is determined based on the superimposed color from the sub-pixels. The image formed by the display panel is dependent on the combination formed by each of the pixels.

The multi-color LED device described herein integrates at least two micro-LED structures horizontally placed in separate areas within a pixel area on the display panel. In some embodiments, multiple light emitting layers are fabricated by bonding in a stacked structure as a starting structure for the multi-color LED device. Each of the multiple light emitting layers is configured to emit a distinct color. The number of light emitting layers corresponds to the number of LED structures within the pixel area of the display panel. For example, if the multi-color LED device includes two sub-pixels, the number of stacked light emitting layers needed during the multi-color LED fabrication process is two. In another example, if the multi-color LED device includes three sub-pixels, the number of stacked light emitting layers needed during the multi-color LED fabrication process is three.

In some embodiments, the color of the top light emitting layer in the stacked multi-layer structures determines the emitted color of the individual LED structure within the multi-color LED device. In order to form the LED structures with various colors from the multiple light emitting layers, extra top layers are removed in the fabrication process for an individual LED structure within the multi-color LED device. For example, in a stacked structure, the top light emitting layer is configured to emit red light, the middle light emitting layer is configured to emit green light, and the bottom light emitting layer is configured to emit blue light. By removing the top two light emitting layers, a blue light LED structure can be formed. By removing the top light emitting layer and short-circuiting the bottom light emitting layer, a green light LED structure can be formed. A red light LED structure can be formed without removing any light emitting layers while short-circuiting the middle and bottom light emitting layers.

Pitch refers to the distance between the centers of adjacent pixels on a display panel. In some embodiments, the pitch can vary from about 40 microns, to about 20 microns, to about 10 microns, and/or preferably to about 5 microns or below. Many efforts have been made to reduce the pitch. A single pixel area is fixed when the pitch specification is determined.

Compared to conventional fabrication processes for micro-LED display chips, which rely on inefficient pick and place processes, the multi-color micro-LED fabrication processes disclosed herein effectively increase the efficiency and reliability of the micro-LED device fabrication, simplify the multi-color LED pixel device structure and reduce damages to the epitaxial layers of the LED device. For example, multiple LED light emitting layers can be directly bonded on the substrate with the pixel drivers. In addition, no substrate for the micro-LED structures remains in the final multi-color device so that cross-talk and mismatch can be reduced.

In addition, since each of the LED light emitting layers is a PN junction, in some embodiments, the relative positions, for example, up and down positions of the P-type region and N-type region layers, within each of the LED light emitting layers in the stacked structure are not consistent. This allows flexibility and efficiency of the electrode connections within the multi-color LED structure.

In some embodiments, a multi-color light-emitting diode (LED) pixel device for a display panel, includes: a substrate at a bottom; a first LED structure, configured to emit a first color, having only one first light emitting layer above the substrate; a second LED structure above the first LED structure, configured to emit a second color, having the first light emitting layer and a second light emitting layer and the second light emitting layer is above the first light emitting layer. In some embodiments, the first light emitting layer includes a second-type layer and a first-type layer, and the first-type layer of the first light emitting layer is above the second-type layer of the first light emitting layer; and, the second light emitting layer includes a first-type layer and a second-type layer, and the second-type layer of the second light emitting layer is above the first-type layer of the second light emitting layer.

In some embodiments, the multi-color LED pixel device further includes a third LED structure configured to emit a third color, having the first light emitting layer, the second light emitting layer, and a third light emitting layer. In some embodiments, the second light emitting layer is above the first light emitting layer, and the third light emitting layer is above the second light emitting layer; and the third light emitting layer includes a first-type layer and a second-type layer, and the second-type layer of the third light emitting layer is above the first-type layer of the third light emitting layer.

In some embodiments, each of the first, second and third light emitting layers includes a respective PN junction, and each of the first-type layers is a P-type layer of the respective PN junction and each of the second-type layers is an N-type layer of the respective PN junction.

In some embodiments, each of the first, second and third light emitting layers includes a respective PN junction, and each of the first-type layers is an N-type layer of the respective PN junction and each of the second-type layers is a P-type layer of the respective PN junction.

In some embodiments of the multi-color LED pixel device, the substrate is an IC substrate, and the multi-color LED pixel device is formed on the IC substrate; the first-type layer of the first light emitting layer in the first LED structure electrically connects to the IC substrate with a first electrode; the first-type layer of the second light emitting layer in the second LED structure electrically connects to the IC substrate with a second electrode; and a top transparent conductive layer covers the multi-color LED pixel device and contacts the second-type layer of the first light emitting layer of the first LED structure and the second-type layer of the second light emitting layer of the second LED structure.

In some embodiments of the multi-color LED pixel device, the first-type layer of the third light emitting layer in the third LED structure electrically connects to the IC substrate with a third electrode; and the top transparent conductive layer contacts the second-type layer of the third light emitting layer of the third LED structure.

In some embodiments of the multi-color LED pixel device, an insulation layer is formed between the top transparent conductive layer and a surface of multi-color LED pixel device.

In some embodiments of the multi-color LED pixel device, a first bonding layer is formed between the IC substrate and the first light emitting layer, and a second bonding layer is formed between the first light emitting layer and the second light emitting layer.

In some embodiments of the multi-color LED pixel device, a third bonding layer is formed between the second light emitting layer and the third light emitting layer.

In some embodiments of the multi-color LED pixel device, a dielectric layer is formed between the first bonding layer and the first light emitting layer.

In some embodiments of the multi-color LED pixel device, the electrode in the second LED structure electrically contacts the first bonding layer and the second bonding layer.

In some embodiments of the multi-color LED pixel device, the electrode in the third LED structure electrically contacts the first bonding layer, the second bonding layer, and the third bonding layer.

In some embodiments of the multi-color LED pixel device, the second-type layer has a protrusion that extends horizontally outside the first-type layer in the first LED structure, an opening is formed in the insulation layer that covers the protrusion, and the top transparent conductive layer is deposited in the opening on the protrusion.

In some embodiments of the multi-color LED pixel device, a first end of the first electrode in the first LED structure touches a top surface of the first-type layer of the first light emitting layer, and a second end of the first electrode touches the IC substrate; the top transparent conductive layer touches the second-type layer of the first light emitting layer in the first LED structure; a first end of the second electrode in the second LED structure electrically connects a bottom of the first-type layer in the second light emitting layer, a second end of the second electrode touches the IC substrate, and a sidewall of the second electrode contacts a sidewall of the first light emitting layer in the second LED structure; and, the top transparent conductive layer touches a top surface of the second-type layer in the second light emitting layer.

In some embodiments of the multi-color LED pixel device, a first end of the third electrode in the third LED structure electrically connects a bottom of the first-type layer in the third light emitting layer, a second end of the third electrode touches the IC substrate, and a sidewall of the third electrode contacts sidewalls of the second light emitting layer and the first light emitting layer in the third LED structure; and, the top transparent conductive layer touches a top surface of a second-type layer in the third light emitting layer.

In some embodiments, a method for fabricating a multi-color light-emitting diode (LED) pixel device for a display panel, includes: providing a first substrate, fabricating a first LED light emitting layer on the first substrate, providing a second substrate, fabricating a second LED light emitting layer on the second substrate, bonding the first LED light emitting layer and the second LED light emitting layer together with a first metal bonding layer, removing the second substrate, providing a third substrate, fabricating a third LED light emitting layer on the third substrate, bonding the second LED light emitting layer and the third LED light emitting layer together with a second metal bonding layer, removing the first substrate, removing the third substrate, and bonding the first LED light emitting layer and a fourth substrate with integrated circuit (IC) together with a third metal bonding layer.

In some embodiments, the method for fabricating the multi-color LED pixel, further includes: after removing the first substrate, fabricating a dielectric layer on the first LED light emitting layer. In some embodiments, a location of the dielectric layer is between the first LED light emitting layer and third metal bonding layer.

In some embodiments, the method for fabricating the multi-color LED pixel device, further includes: patterning a first LED structure using the first LED light emitting layer while removing the second and the third LED light emitting layers; patterning a second LED structure using the first and the second LED light emitting layers while removing the third LED light emitting layers; and patterning a third LED structure using the first, the second and the third LED light emitting layers.

In some embodiments, the method for fabricating the multi-color LED pixel device, further includes: depositing a first electrode to electrically connects a first P-type region of the first LED light emitting layer with the IC on the fourth substrate in the first LED structure; depositing a second electrode to electrically connects a second P-type region of the second LED light emitting layer with the IC on the fourth substrate in the second LED structure; depositing a third electrode to electrically connects a third P-type region of the third LED light emitting layer with the IC on the fourth substrate in the third LED structure; and depositing a common electrode to electrically connects to a first N-type region of the first LED light emitting layer in the first LED structure, a second N-type region of the second LED light emitting layer in the second LED structure, and a third N-type region of the third LED light emitting layer in the third LED structure with a ground.

In some embodiments of the method for fabricating the multi-color LED pixel device, the first P-type region is on a top layer of the first LED light emitting layer and the first N-type region is on a bottom layer of the first LED light emitting layer; the second P-type region is on a bottom layer of the second LED light emitting layer and the second N-type region is on a top layer of the second LED light emitting layer; and the third P-type region is on a bottom layer of the third LED light emitting layer and the third N-type region is on a top layer of the third LED light emitting layer.

The compact design of the multi-color LED devices and systems disclosed herein utilizes the lateral different light emitting layers, thereby reducing the complexity of the fabrication steps and increase the overall performance to cost ratio of the LED display systems. Furthermore, the fabrication of the multi-color LED display systems can reliably and efficiently form the LED structure patterns without using or retaining extra substrates. Thus, implementation of the multi-color LED display systems can satisfy the rigorous display requirements for AR and VR, heads-up displays (HUD), mobile device displays, wearable device displays, high definition small projectors, and automotive displays compared with the use of the conventional LEDs.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

Figure 1A:
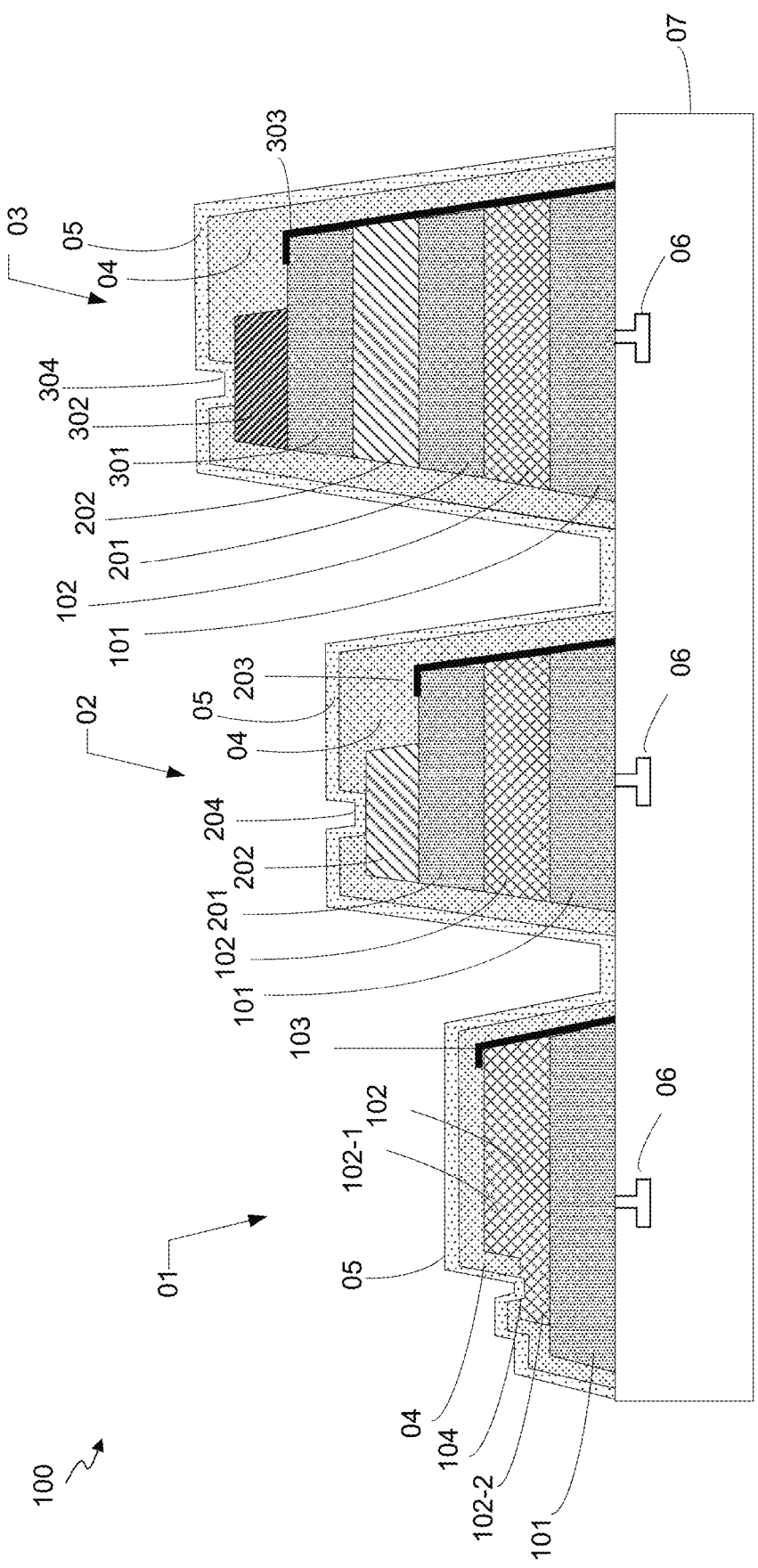
FIG. 1A is a cross-sectional view of a tri-color LED device, in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

Generally, at least red, green and blue colors are superimposed to reproduce a broad array of colors. In some instances, to include at least red, green and blue colors within a pixel area, separate monochromatic LED structures are fabricated at different non-overlapping zones within the pixel area.

FIG. 1A is a cross-sectional view of a tri-color LED device 100, in accordance with some embodiments. In some embodiments, the tri-color LED device 100 is a single pixel device within a pixel area in a display panel. In some embodiments, the tri-color LED device includes three LED structures 01, 02 and 03. Each of the LED structures is a sub-pixel within the single pixel area. In some embodiments, the three LED structures each emit a single color, for example, LED structure 01 emits blue light, LED structure 02 emits green light, and LED structure 03 emits red light. In some embodiments, the colors emitted by the three LED structures are different and distinct.

In some embodiments, a display panel includes a plurality of pixels, such as millions of pixels, and each pixel includes a tri-color LED device. In some embodiments, the LED devices can be micro LEDs. Micro LEDs typically have a lateral dimension of 50 microns (um) or less, and can have lateral dimensions less than 10 um and even just a few um.

In some embodiments, the tri-color LED device includes a substrate 07. For convenience, "up" is used to mean away from the substrate 07, "down" means toward the substrate 07, and other directional terms such as top, bottom, above, below, under, beneath, etc. are interpreted accordingly. The supporting substrate 07 is the substrate on which the array of individual driver circuits 06 is fabricated. In some embodiments, the driver circuits could also be located in one of the layers above the substrate 07, or above the micro tri-color LED structure 100. Each driver circuit 06 is a pixel driver. In some instances, the pixel drivers are thin-film transistor pixel drivers or silicon CMOS pixel drivers. In one embodiment, the substrate 07 is a Si substrate. In another embodiment, the supporting substrate 07 is a transparent substrate, for example, a glass substrate. Other example substrates include GaAs, GaP, InP, SiC, ZnO, and sapphire substrates. The driver circuits 06 form individual pixel drivers to control the operation of the individual tri-color LED device 100. The circuitry on substrate 07 includes contacts to each individual pixel driver 06 and also a ground contact. Each of the micro LED structures 01, 02 and 03 also has two types of contacts: P electrodes or anodes, such as 103, 203 and 303, which are connected to the respective driver circuit 06; and N electrodes or cathodes, such as layer 05, which is connected to the ground (i.e., the common electrode).

In some embodiments, the driver circuit 06, for example, a pixel driver, includes a number of transistors and capacitors (not shown in FIG. 1A). The transistors include a driving transistor connected to a voltage supply, and a control transistor configured with its gate connected to a scan signal bus line. The capacitors include a storage capacitor used maintain the gate voltage of the driving transistor during the time that the scan signal is setting other pixels.

Although some features are described herein with the term "layer", it should be understood that such features are not limited to a single layer but may include a plurality of sublayers. In some instance, a "structure" can take the form of a "layer".

In some embodiments, the three LED structures 01, 02 and 03 each include at most three light emitting layers 302, 202, and 102. For example, the LED structure 01 includes one light emitting layer 102. In some embodiments, a metal bonding layer 101 is between the light emitting layer 102 and the substrate 07 and/or the driver circuit 06. In some embodiments, an optional dielectric layer 106 (not shown in FIG. 1A) is placed between the metal bonding layer 101 and the light emitting layer 102.

The LED structure 02 includes two light emitting layers 102 and 202, and the light emitting layer 202 is above the light emitting layer 102. In some embodiments, a metal bonding layer 201 is between the light emitting layer 102 and the light emitting layer 202. In some embodiments, a metal bonding layer 101 is between the light emitting layer 102 and the substrate 07 and/or the driver circuit 06. In some embodiments, an optional dielectric layer 106 (not shown in FIG. 1A) is placed between the metal bonding layer 101 and the light emitting layer 102.

The LED structure 03 includes three light emitting layers 102, 202, and 302, and the light emitting layer 302 is above the light emitting layer 202, which is above the light emitting layer 102. In some embodiments, a metal bonding layer 301 is between the light emitting layer 202 and the light emitting layer 302. In some embodiments, a metal bonding layer 201 is between the light emitting layer 102 and the light emitting layer 202. In some embodiments, a metal bonding layer 101 is between the light emitting layer 102 and the substrate 07 and/or the driver circuit 06. In some embodiments, an optional dielectric layer 106 (not shown in FIG. 1A) is placed between the metal bonding layer 101 and the light emitting layer 102.

In some embodiments, the light emitting layer 102 is configured to emit blue light. In some embodiments, the light emitting layer 202 is configured to emit green light. In some embodiments, the light emitting layer 302 is configured to emit red light.

In some embodiments, the various layers across the three LED structures 01, 02 and 03 are formed in the same step and/or the same process during the fabrication. For example, the metal bonding layer 101 is formed in the same step and/or the same process across all three LED structures 01, 02 and 03. For example, an optional dielectric layer 106 (not shown in FIG. 1A) is formed in the same step and/or the same process across all three LED structures 01, 02 and 03 between the metal bonding layer 101 and the light emitting layer 102. For example, the light emitting layer 102 is formed in the same step and/or the same process across all three LED structures 01, 02 and 03. For example, the metal bonding layer 201 is formed in the same step and/or the same process across the two LED structures 02 and 03. For example, the light emitting layer 202 is formed in the same step and/or the same process across the two LED structures 02 and 03.

In some embodiments, an electrode 103 is placed on the sidewall of the LED structure 01 via coating or evaporation deposition, which extends from the bottom metal bonding layer 101 to a top region or top layer 102-1 of the blue LED light emitting layer 102. In some embodiments, the electrode 103 is a P-electrode. In some embodiments, the electrode 103 is connected through the metal bonding layer 101 to the driver circuit 06. In some embodiments, the driver circuit 06 is an integrated circuit which controls the P-electrode 103. In some embodiments, an insulation layer 04 such as a Silicon Dioxide layer is coated or deposited on the surface and sidewalls of the LED structure 01. In some embodiments, the insulation layer 04 also extends around the electrode 103 to prevent it from touching other features and layers in the LED structure 01 other than the metal bonding layer 101 and the top region or top layer 102-1 of the blue LED light emitting layer 102 (not shown in FIG. 1A). In some embodiments, a transparent conductive layer 05 such as an Indium tin oxide (ITO) layer is coated on top of the insulation layer 04. The transparent conductive layer 05 connects to the bottom region or bottom layer of the blue LED light emitting layer 102 through an etched opening 104 in the insulation layer 04 as the N-electrode or the common electrode. In some embodiments, as illustrated in FIG. 1A, the bottom region or bottom layer of the light emitting layer 102 has a protruded region 102-2 that has a longer horizontal dimension than the top region or top layer 102-1 of the same light emitting layer 102. The protruded portion 102-2 connects to the transparent conductive layer 05. The LED structure 03 emits light from the blue LED light emitting layer 102.

In some embodiments, an electrode 203 is placed on the sidewall of the LED structure 02 via coating or evaporation deposition, which extends from the bottom metal bonding layer 101 to the metal bonding layer 201. In some embodiments, the electrode 203 connects to the top of the metal bonding layer 201 as shown in FIG. 1A. The electrode 203 short-circuits the LED light emitting layers in between the two metal bonding layers 101 and 201, such as the blue LED light emitting layer 102. In some embodiments, the electrode 203 is a P-electrode which connects to the bottom region or bottom layer of the light emitting layer 202 through the metal bonding layer 201. In some embodiments, the electrode 203 is connected through the metal bonding layer 101 to the driver circuit 06. In some embodiments, the driver circuit 06 is an integrated circuit which controls the P-electrode 203. In some embodiments, an insulation layer 04 such as a Silicon Dioxide layer is coated or deposited on the surface and sidewalls of the LED structure 02. In some embodiments, a transparent conductive layer 05 such as an Indium tin oxide (ITO) layer is coated on top of the insulation layer 04. The transparent conductive layer 05 connects to the top region or top layer of the green LED light emitting layer 202 through an etched opening 204 in the insulation layer 04 as the N-electrode or the common electrode. Since the blue LED light emitting layer 102 is short-circuited in the LED structure 02, no light is emitted from the blue LED light emitting layer 102 and the LED structure 02 emits light from the green LED light emitting layer 202.

In some embodiments, an electrode 303 is placed on the sidewall of the LED structure 03 via coating or evaporation deposition, which extends from the bottom metal bonding layer 101 to the top metal bonding layer 301 as shown in FIG. 1A. In some embodiments, the electrode 303 connects to the top of the metal bonding layer 301. In some embodiments, the electrode 303 is in electrical contact with the LED light emitting layers and the metal bonding layers in between the two metal bonding layers 101 and 301, such as the blue LED light emitting layer 102, the green LED light emitting layer 202, and the metal bonding layer 201. In some embodiments, the electrode 303 short-circuits the LED light emitting layers and the metal bonding layers in between the two metal bonding layers 101 and 301, such as the blue LED light emitting layer 102, the green LED light emitting layer 202, and the metal bonding layer 201. In some embodiments, the electrode 303 is a P-electrode which connects to the bottom region or bottom layer of the light emitting layer 302 through the metal bonding layer 301. In some embodiments, the electrode 303 is connected through the metal bonding layer 101 to the driver circuit 06. In some embodiments, the driver circuit 06 is an integrated circuit which controls the P-electrode 303. In some embodiments, an insulation layer 04 such as a Silicon Dioxide layer is coated or deposited on the surface and sidewalls of the LED structure 03. In some embodiments, a transparent conductive layer 05 such as an Indium tin oxide (ITO) layer is coated on top of the insulation layer 04. The transparent conductive layer 05 connects to the top region or top layer of the red LED light emitting layer 302 through an etched opening 304 in the insulation layer 04 as the N-electrode or the common electrode. Since the blue LED light emitting layer 102, and the green LED light emitting layer 202 are short-circuited in the LED structure 03, no light is emitted from the blue LED light emitting layer 102 and from the green LED light emitting layer 202 and the LED structure 03 emits light from the red LED light emitting layer 302.

In some embodiments, an LED light emitting layer, such as 102, 202, and 302, includes many epitaxial sub-layers with different compositions. Examples of the LED light emitting layer includes III-V nitride, III-V arsenide, III-V phosphide, and III-V antimonide epitaxial structures. Examples of LED light emitting layers include GaN based UV/blue/green light emitting layers, AlInGaP based red/orange light emitting layers, and GaAs or InP based infrared (IR) light emitting layers.

In some embodiments, each of the LED structures 01, 02 and 03, can be controlled individually to generate its individual light. In some embodiments, the combined light from the tri-color LED device 100 resulting from the operation of all the LED structures 01, 02 and 03 in the tri-color LED device 100 can change the color of a single pixel on a display panel within a small footprint.

In some embodiments, depending on the design of the tri-color LED device 100, the emitted colors of the LED structures included in the same device are not limited to red, green and blue. For example, suitable colors can be selected from a range of different colors from a wavelength of 380 nm to 700 nm in visible color range. In some embodiments, LED structures emitting other colors from invisible range such as ultra-violet and infrared can be implemented. For example, the three-color choice of the LED light emitting layers, from bottom to top can be blue, green, and red. In another embodiment, the three-color choice, from bottom to top can be ultra-violet, orange, and infrared. In some embodiments, other arrangements of the LED light emitting layers are possible and the order of the colors of the light emitting layers deposited from bottom to top can also be changed to combinations such as red, green and blue, or infrared, orange, and ultra-violet, or any other combinations. In some embodiments, the color of a particular LED light emitting layer, such as 102, 202 and 302, can be selected to emit any color suitable for the design and functionality of the LED device 100.

In some embodiments, the light emitting layer 102 is bonded to the substrate 07 through the metal bonding layer 101. In some embodiments, the light emitting layer 202 is bonded to light emitting layer 102 through the metal bonding layer 201. In some embodiments, the light emitting layer 302 is bonded to light emitting layer 202 through the metal bonding layer 301. In some embodiments, each of the metal bonding layer s 101, 201 and 301 can also be used as a reflector to reflect light emitted from the LED light emitting layer such as 102, 202, and 302, immediately above the respective metal bonding layer. In some embodiments, the metal bonding layer 101, 201 or 301 can be a transparent metal bonding layer.

In some embodiments, optional reflection layers (not shown in FIG. 1A) are formed between the LED light emitting layers to improve light emission efficiency.

Figure 1B:
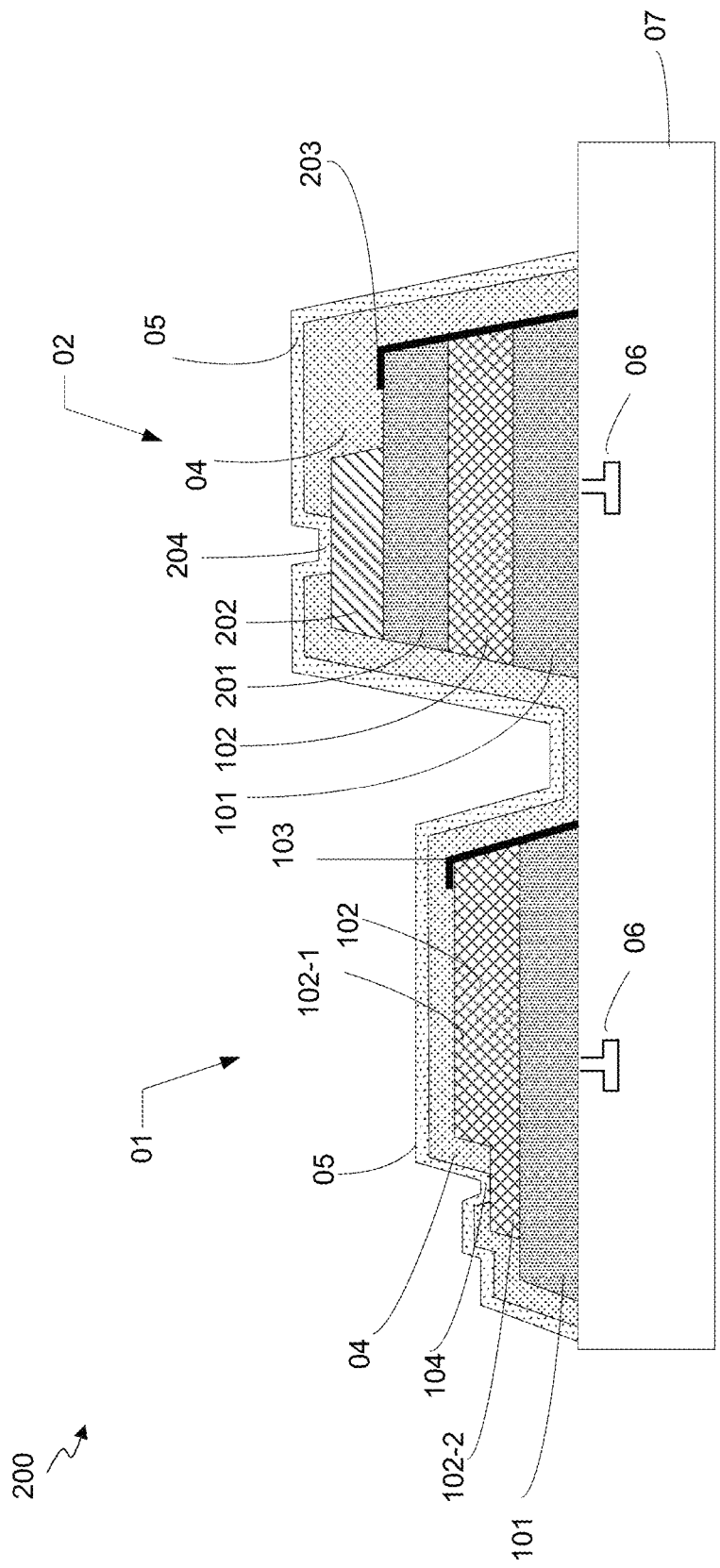
FIG. 1B is a cross-sectional view of a two-color LED device, in accordance with some embodiments.

FIG. 1B is a cross-sectional view of a two-color LED device 200, in accordance with some embodiments. In some embodiments, a multi-color LED device only includes two LED structures 01 and 02 (included in FIG. 1B) as shown and described in FIG. 1A. There are two light emitting layers formed in the fabrication process within the single pixel two-color LED device.

In some embodiments, a multi-color LED device may include more than three LED structures, such as four, five and six LED structures, etc, within a pixel area. The number of light emitting layers formed in the fabrication process is the same as the number of LED structures within the single pixel multi-color LED device. For example, if there are four LED structures within the single pixel multi-color LED device, the number of light emitting layers needed during the fabrication process is also four.

Figure 2:
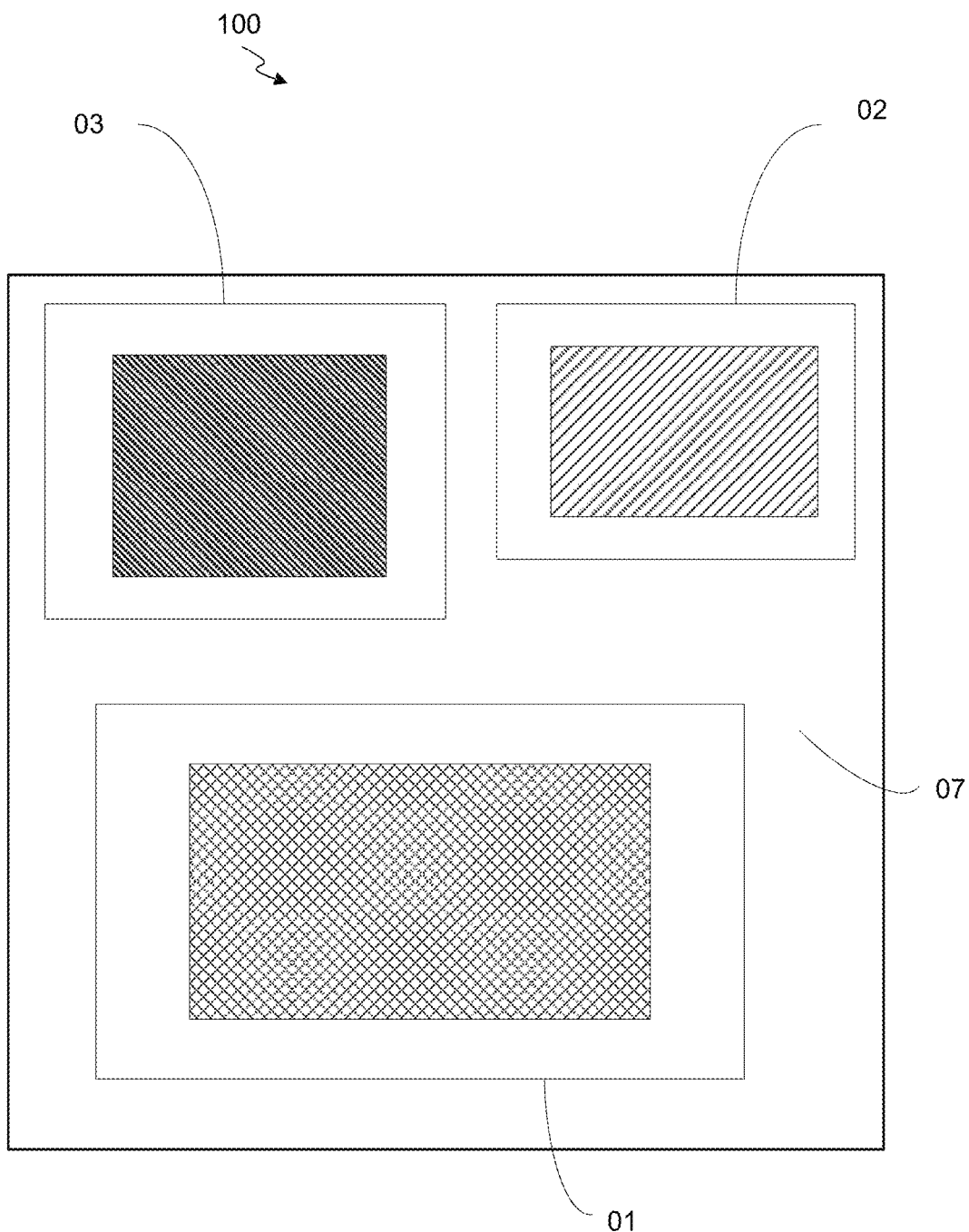
FIG. 2 illustrates a top view of a tri-color LED device, in accordance with some embodiments.

FIG. 2 illustrates a top view of the tri-color LED device 100 shown in FIG. 1A, in accordance with some embodiments. As shown in FIG. 1A, the tri-color LED device include three LED structures 01, 02 and 03 on supporting substrate 07. As described in FIG. 1A, the LED structure 01 emits blue LED light, the LED structure 02 emits green LED light, and the LED structure 03 emits red LED light. In some embodiments, each of the LED structures 01, 02 and 03 has a rectangular shape. In some embodiments, the LED structures can take other types of shapes such as circle, oval, square, parallelogram, triangle, trapezoid, polygon, etc. In some embodiments, the shapes of the three LED structures can be different. In some embodiments, the areas of each of the LED structures 01, 02 and 03 are different, for example, the area of the blue LED structure 01 is the largest, and the area of the green LED structure 02 is the smallest among the three LED structures. In some embodiments, the areas of the LED structures are the same.

Figure 3A:
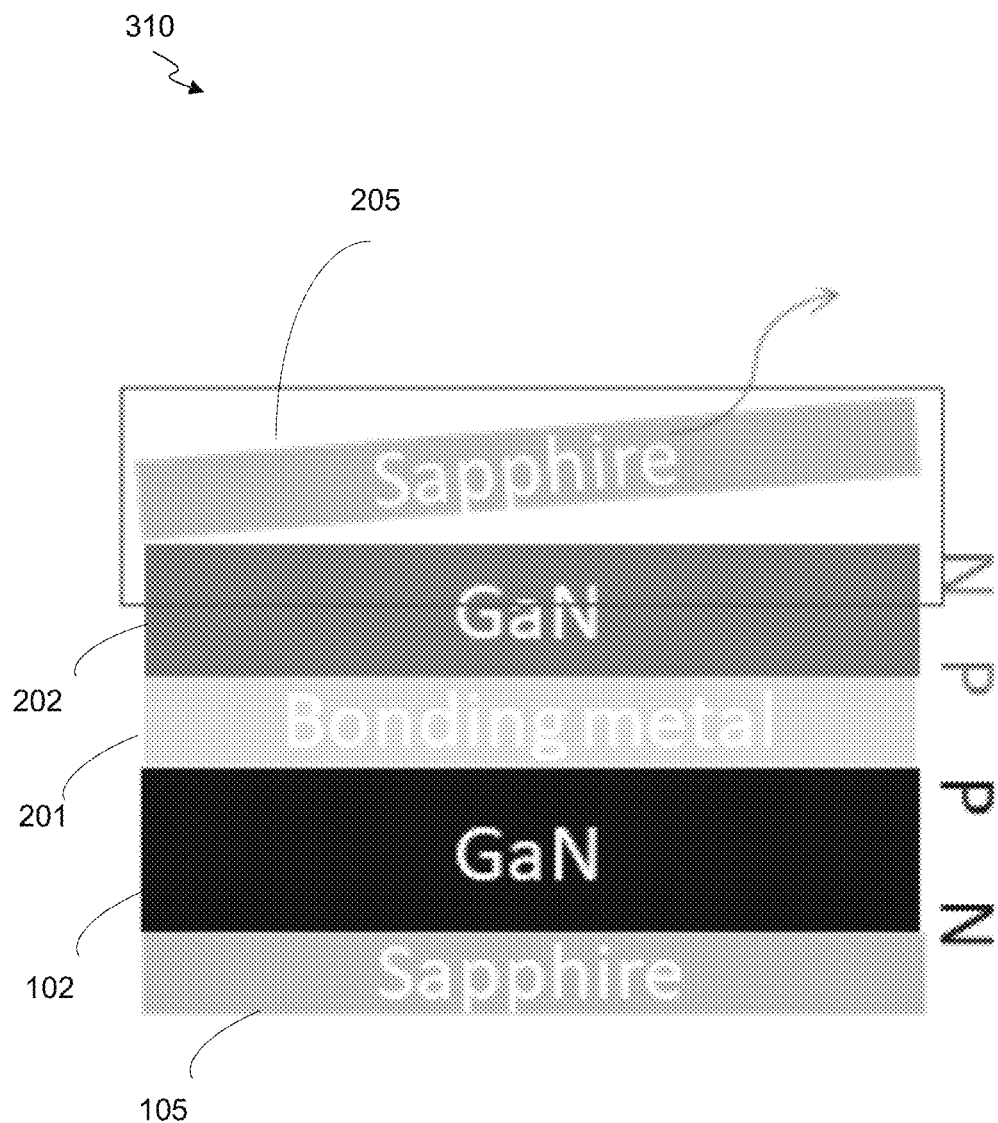
FIG. 3A is a cross-sectional view of a multiple layer structure for forming a tri-color LED device, in accordance with some embodiments.

FIG. 3A is a cross-sectional view of a multiple layer structure 310 for forming the tri-color LED device (as shown as 100 in FIG. 1A and FIG. 2), in accordance with some embodiments. More specifically, FIG. 3A illustrates the fabrication process of the multiple layers for the tri-color LED device.

FIG. 3A shows the substrate 105 supporting the LED light emitting layer 102. In some embodiments, the substrate 105 consists of sapphire. In some embodiments, the LED light emitting layer 102 is grown on the substrate 105. In some embodiments, the LED light emitting layer 102 is an epitaxial layer on the substrate 105. In some embodiments, the LED light emitting layer 102 is for forming blue micro LEDs. In some embodiments, the LED light emitting layer 102 includes GaN based blue light emitting layers. Examples of a blue LED epitaxial layer include III-V nitride, III-V arsenide, III-V phosphide, and III-V antimonide epitaxial structures. In some instances, films within the blue LED light emitting layer 102 can include the layers of P-type GaN/InGaN light-emitting layer/N-type GaN. In some embodiments, P type is generally Mg-doped, and N-type is generally Si-doped. In some examples, the thickness of the LED light emitting layer 102 is about 0.3 micron to about 5 microns.

FIG. 3A also shows a separate substrate 205 supporting the LED light emitting layer 202. In some embodiments, the substrate 205 consists of sapphire. In some embodiments, the LED light emitting layer 202 is grown on the substrate 205. In some embodiments, the LED light emitting layer 202 is an epitaxial layer on the substrate 205. In some embodiments, the LED light emitting layer 202 is for forming green micro LEDs. In some embodiments, the LED light emitting layer 202 include GaN based green light emitting layers. Examples of a green LED epitaxial layer include III-V nitride, III-V arsenide, III-V phosphide, and III-V antimonide epitaxial structures. In some instances, films within the green LED light emitting layer 202 can include the layers of P-type GaN/InGaN light-emitting layer/N-type GaN. In some embodiments, P type is generally Mg-doped, and N-type is generally Si-doped. In some examples, the thickness of the LED light emitting layer 202 is about 0.3 micron to about 5 microns.

In some embodiments, a metal bonding layer 201 bonds the LED light emitting layers 102 and 202 together. In one approach, a metal bonding layer 201 is grown on the LED light emitting layers 102 and/or 202. The metal bonding layer 201 may include ohmic contact layers in addition to the metal bonding layers. In some embodiments, the thickness of the metal bonding layer 201 is about 0.1 micron to about 3 microns. In some instances, two metal layers are included in the metal bonding layer 201. One of the metal layers is deposited on the light emitting layer 102. A counterpart metal bonding layer is also deposited on the light emitting layer 202. In some embodiments, compositions for the metal bonding layer 201 include Au—Au bonding, Au—Sn bonding, Au—In bonding, Ti—Ti bonding, Cu—Cu bonding, or a mixture thereof. For example, if Au—Au bonding is selected, the two layers of Au respectively need a Cr coating as an adhesive layer, and Pt coating as an anti-diffusion layer. And the Pt coating is between the Au layer and the Cr layer. The Cr and Pt layers are positioned on the top and bottom of the two bonded Au layers. In some embodiments, when the thicknesses of the two Au layers are about the same, under a high pressure and a high temperature, the mutual diffusion of Au on both layers bonds the two layers together. Eutectic bonding, thermal compression bonding, and transient liquid phase (TLP) bonding are example techniques that may be used.

In general, an LED light emitting layer includes a PN junction with a p-type region/layer and an n-type region/layer, and an active layer between the p-type region/layer and n-type region/layer. In some embodiments, the p-type region/layer of the LED light emitting layer 102 is close to the metal bonding layer 201 and the n-type region/layer of the LED light emitting layer 102 is close to the substrate 105. In some embodiments, the p-type region/layer of the LED light emitting layer 202 is close to the metal bonding layer 201 and the n-type region/layer of the LED light emitting layer 202 is close to the substrate 205.

In some embodiments, the substrate 205 is then removed after bonding, for example, by a laser lift-off process or wet chemical etching, leaving the structure including the substrate 105, the light emitting layer 102, the metal bonding layer 201, and the light emitting layer 202.

Figure 3B:
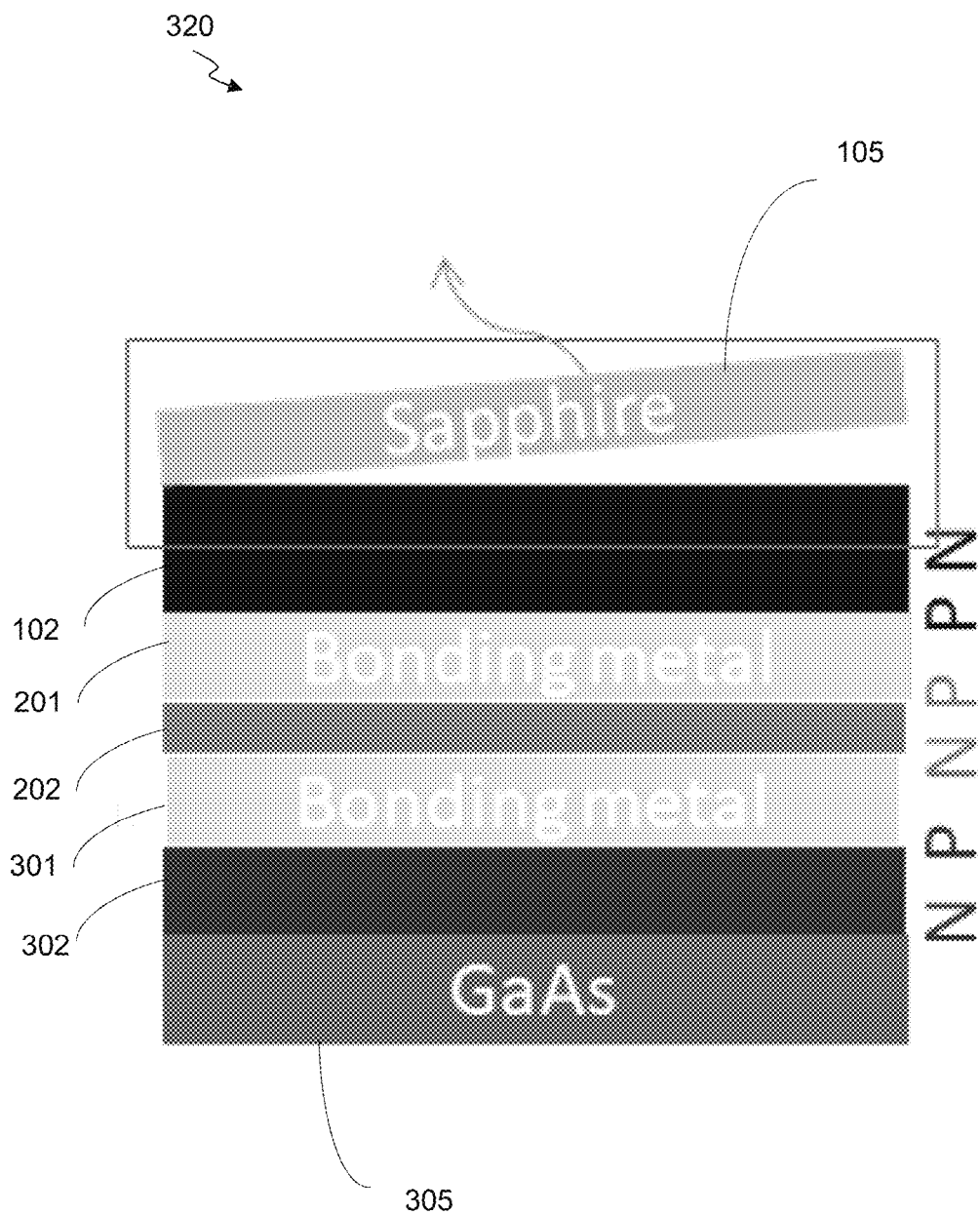
FIG. 3B is a cross-sectional view of a multiple layer structure for forming a tri-color LED device, in accordance with some embodiments.

FIG. 3B is a cross-sectional view of a multiple layer structure 320 for forming the tri-color LED device (as shown as 100 in FIG. 1A and FIG. 2), in accordance with some embodiments. More specifically, FIG. 3B illustrates the fabrication process of the multiple layers for the tri-color LED device.

FIG. 3B shows the substrate 305 supporting the LED light emitting layer 302. In some embodiments, the substrate 305 consists of gallium arsenide (GaAs). In some embodiments, the LED light emitting layer 302 is grown on the substrate 305. In some embodiments, the LED light emitting layer 302 is an epitaxial layer on the substrate 305. In some embodiments, the light emitting layer 302 is for forming red micro LEDs. In some embodiments, the LED light emitting layer 302 includes red light emitting layers. Examples of a red LED epitaxial layer include III-V nitride, III-V arsenide, III-V phosphide, and III-V antimonide epitaxial structures. In some instances, films within the red LED light emitting layer 302 can include the layers of P-type GaP/P-type AlGaInP light-emitting layer/AlGaInP/N-type AlGaInP/N-type GaAs. In some embodiments, P type is generally Mg-doped, and N-type is generally Si-doped. In some examples, the thickness of the LED light emitting layer 305 is about 0.3 micron to about 5 microns.

In some embodiments, a metal bonding layer 301 bonds the LED light emitting layers 202 and 302 together. In one approach, a metal bonding layer 301 is grown on the LED light emitting layers 302 and/or 202. The metal bonding layer 301 may include ohmic contact layers in addition to the metal bonding layers. In some embodiments, the thickness of the metal bonding layer 301 is about 0.1 micron to about 3 microns. In some instances, two metal layers are included in the metal bonding layer 301. One of the metal layers is deposited on the light emitting layer 302. A counterpart metal bonding layer is also deposited on the light emitting layer 202. In some embodiments, compositions for the metal bonding layer 202 include Au—Au bonding, Au—Sn bonding, Au—In bonding, Ti—Ti bonding, Cu—Cu bonding, or a mixture thereof. For example, if Au—Au bonding is selected, the two layers of Au respectively need a Cr coating as an adhesive layer, and Pt coating as an anti-diffusion layer. And the Pt coating is between the Au layer and the Cr layer. The Cr and Pt layers are positioned on the top and bottom of the two bonded Au layers. In some embodiments, when the thicknesses of the two Au layers are about the same, under a high pressure and a high temperature, the mutual diffusion of Au on both layers bonds the two layers together. Eutectic bonding, thermal compression bonding, and transient liquid phase (TLP) bonding are example techniques that may be used.

In general, an LED light emitting layer consists of a PN junction. In some embodiments, the p-type region/layer of the LED light emitting layer 302 is close to the metal bonding layer 301 and the n-type region/layer of the LED light emitting layer 302 is close to the substrate 305.

In some embodiments, the substrate 105 is then removed after bonding, for example, by a laser lift-off process or wet chemical etching, leaving the structure including the substrate 305, the light emitting layer 302, the metal bonding layer 301, the light emitting layer 202, the metal bonding layer 201, and the light emitting layer 102.

Figure 3C:
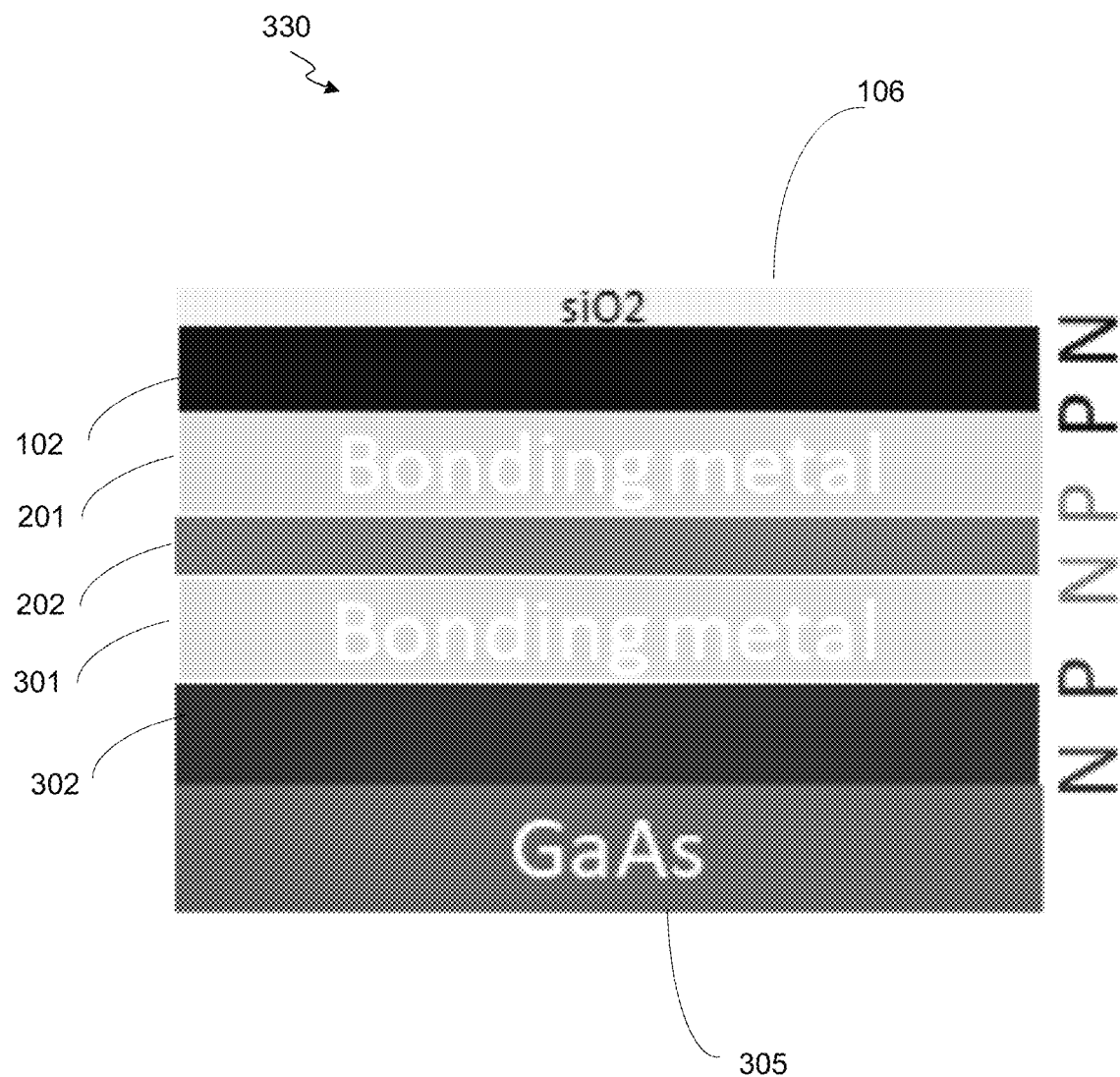
FIG. 3C is a cross-sectional view of a multiple layer structure for forming a tri-color LED device, in accordance with some embodiments.

FIG. 3C is a cross-sectional view of a multiple layer structure 330 for forming the tri-color LED device (as shown as 100 in FIG. 1A and FIG. 2), in accordance with some embodiments. More specifically, FIG. 3C illustrates the fabrication process of the multiple layers for the tri-color LED device.

In some embodiments, a dielectric layer 106 is coated on the light emitting layer 102 before further bonding. In some embodiments, the dielectric layer 106 includes a SiO2 layer.

Figure 3D:
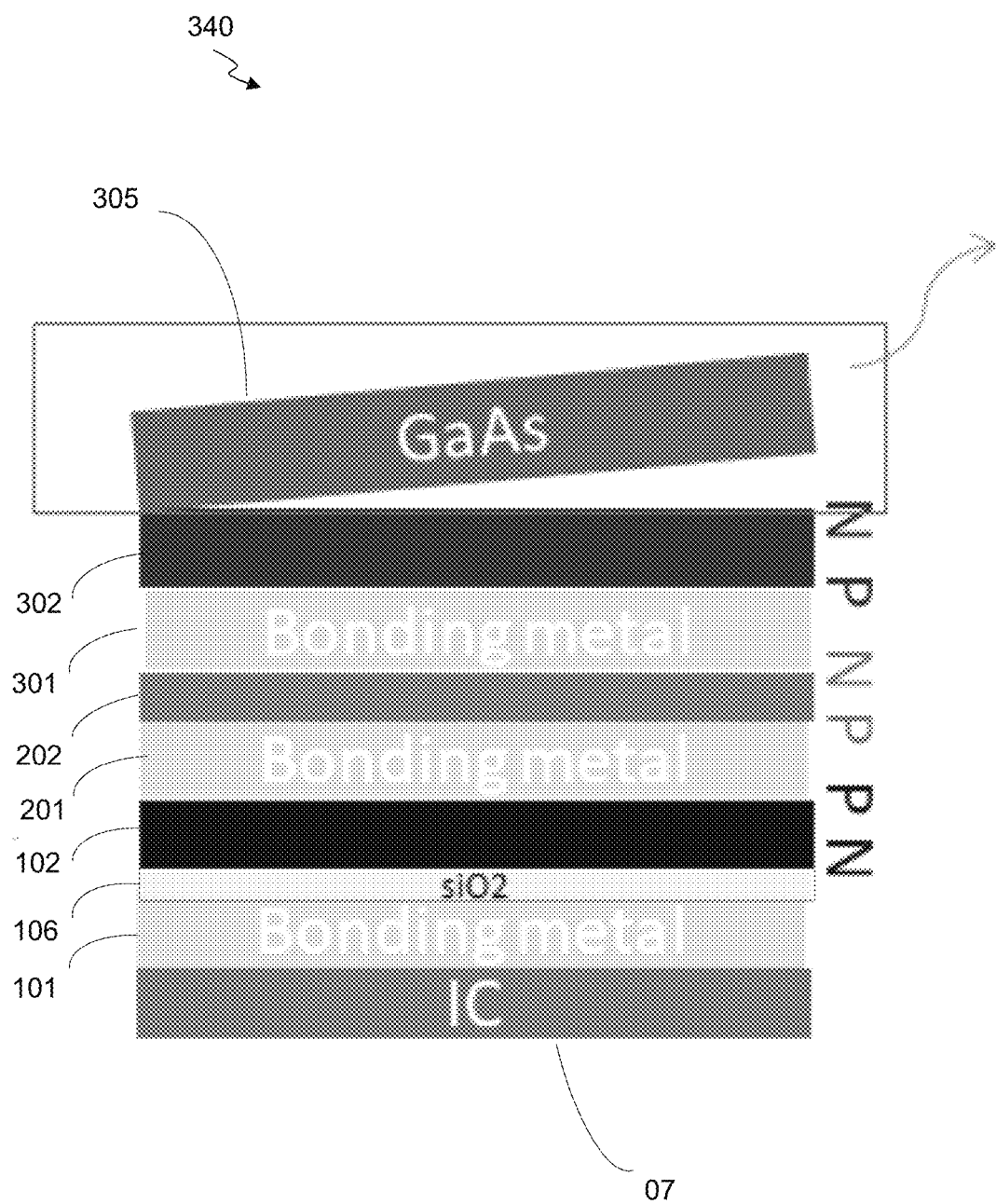
FIG. 3D is a cross-sectional view of a multiple layer structure for forming a tri-color LED device, in accordance with some embodiments.

FIG. 3D is a cross-sectional view of a multiple layer structure 340 for forming the tri-color LED device (as shown as 100 in FIG. 1A and FIG. 2), in accordance with some embodiments. More specifically, FIG. 3D illustrates the fabrication process of the multiple layers for the tri-color LED device.

In some embodiments, for example, as described above in FIG. 3D, from bottom to top, the order of the layers within the light emitting layer 102 can be N (bottom) and P (top), the order of the layers within the light emitting layer 202 can be P (bottom) and N (top), and the order of the layers within the light emitting layer can be P (bottom) and N (top).

In some embodiments, a metal bonding layer 101 bonds the LED light emitting layer 102 (when an optional dielectric layer 106 is not present) and a substrate with the integrated circuits including the pixel driver 06 (as shown in FIG. 1A) together. In some embodiments, the substrate 07 includes silicon. In some embodiments, a metal bonding layer 101 bonds the dielectric layer 106 which is on the surface of the LED light emitting layer 102 and a substrate with the integrated circuits including the pixel driver 06 (as shown in FIG. 1A) together. In one approach, a metal bonding layer 101 is grown on the substrate 07 and/or the LED light emitting layer 102 (when an optional dielectric layer 106 is not present). In another approach, a metal bonding layer 101 is grown on the substrate 07 and/or the dielectric layer 106 which is on the surface of the LED light emitting layer 102. The metal bonding layer 101 may include ohmic contact layers in addition to the metal bonding layers. In some embodiments, the thickness of the metal bonding layer 101 is about 0.1 micron to about 3 microns. In some instances, two metal layers are included in the metal bonding layer 101. One of the metal layers is deposited on the light emitting layer 102 (when an optional dielectric layer 106 is not present) or the dielectric layer 106 which is on the surface of the LED light emitting layer 102. A counterpart metal bonding layer is also deposited on the substrate 07. In some embodiments, compositions for the metal bonding layer 101 include Au—Au bonding, Au—Sn bonding, Au—In bonding, Ti—Ti bonding, Cu—Cu bonding, or a mixture thereof. For example, if Au—Au bonding is selected, the two layers of Au respectively need a Cr coating as an adhesive layer, and Pt coating as an anti-diffusion layer. And the Pt coating is between the Au layer and the Cr layer. The Cr and Pt layers are positioned on the top and bottom of the two bonded Au layers. In some embodiments, when the thicknesses of the two Au layers are about the same, under a high pressure and a high temperature, the mutual diffusion of Au on both layers bonds the two layers together. Eutectic bonding, thermal compression bonding, and transient liquid phase (TLP) bonding are example techniques that may be used.

In some embodiments, the dielectric layer 106 can be used as an insulation layer. In some embodiments, when the n-type region/layer of the LED light emitting layer 102 is close to the metal bonding layer 101, the dielectric layer 106 can electrically insulate the n-type region/layer of the LED light emitting layer 102 from the metal bonding layer 101.

In some embodiments, the dielectric layer 106 can be used as a reflection layer. The reflection layer 106 is between the metal bonding layer 101 and the light emitting layer 102 after bonding. In some instances, the thickness of the reflection layer 106 is about 0.1 micron to about 5 microns. In some embodiments, the reflection layer 106 includes a distributed Bragg reflector (DBR) structure. For example, the reflection layer 106 is formed from multiple layers of alternating or different materials with varying refractive index. In some instances, each layer boundary of the DBR structure causes a partial reflection of an optical wave. The reflection layer 106 can be used to reflect some selected wavelengths, for example, blue light. In some embodiments, the reflection layer 106 is made of multiple layers of SiO2 and Ti3O5. By varying the thicknesses and numbers of layers of SiO2 and Ti3O5 respectively, selective reflection or transmission of light at different wavelengths can be formed. In some embodiments, the reflection layer 106 for a red light LED includes multiple layers of Au or/and Indium Tin Oxide (ITO).

In some embodiments, the substrate 305 is then removed after bonding, for example, by a laser lift-off process or wet chemical etching, leaving the structure from bottom to top including the substrate 07, the bonding metal layer 101, the optional insulation layer/reflection layer 106, the light emitting layer 102, the metal bonding layer 201, the light emitting layer 202, the metal bonding layer 301, and the light emitting layer 302.

In some embodiments, as illustrated above, in the device fabrication process, the three LED light emitting layers are formed in a stacked structure, for example, the green LED light emitting layer 202 is on top of the blue LED light emitting layer 102, and the blue LED light emitting layer 302 is on top of the green light emitting layer 202. In some embodiments, various bonding layers 101, 201 and 301 are placed between the substrate 07 and the LED light emitting layer 102, between the LED light emitting layers 102 and 202, and between LED light emitting layers 202 and 302, respectively.

In order to form the three LED structures 01, 02 and 03 as shown in FIG. 1A, the structure 340 formed from FIG. 3D (after removing the substrate 305) is further patterned. For example, additional mask layers and different etching steps can be applied to pattern the three LED structures 01, 02 and 03 in FIG. 1A. In some embodiments, in order to get the LED structure 01, the metal bonding layer 201, the light emitting layer 202, the metal bonding layer 301, and the light emitting layer 302 are removed within the LED structure 01. In some embodiments, in order to get the LED structure 02, the metal bonding layer 301, and the light emitting layer 302 are removed within the LED structure 02. In some embodiments, all the layers including the bonding metal layer 101, the optional insulation layer/reflection layer 106, the light emitting layer 102, the metal bonding layer 201, the light emitting layer 202, the metal bonding layer 301, and the light emitting layer 302 are removed from the space outside the LED structures 01, 02 and 03.

In some embodiments, as described in FIG. 1A, the electrodes 103, 203 and 303 are formed on the LED structures 01, 02 and 03, respectively. In some embodiments, the electrodes 103, 203 and 303 electrically connect to the p-type layers of the light emitting layers 102, 202, and 302 respectively. An insulation layer 04, such as silicon dioxide, is then formed over the LED structures 01, 02 and 03 as described in FIG. 1A. In some embodiments, the insulation layer 04 is also formed in the space or gap between the LED structures 01, 02 and 03 (not shown in FIG. 1A). In some embodiments, as described in FIG. 1A, an opening 104 is formed in the insulation layer 04 to expose the surface of the bottom N-type layer 102-2 of the light emitting layer 102. In some embodiments, as described in FIG. 1A, an opening 204 is formed in the insulation layer 04 to expose the top surface (N-type layer) of the light emitting layer 202. In some embodiments, as described in FIG. 1A, an opening 304 is formed in the insulation layer 04 to expose the top surface (N-type layer) of the light emitting layer 302. In some embodiments, an ITO layer 05 is formed over the entire surface of multi-color LED device 100 and connects to the N-type layers of the light emitting layers 102, 202, and 302 respectively through the openings 104, 204 and 304.

In some embodiments, the location or positioning of all the P-type layers (or regions) and N-type layers (or regions) within each of the LED light emitting layers can be interchanged. For example, for FIG. 3D, from bottom to top, the order of the layers within the light emitting layer 102 can be P (bottom) and N (top), the order of the layers within the light emitting layer 202 can be N (bottom) and P (top), and the order of the layers within the light emitting layer can be N (bottom) and P (top) (not shown in FIG. 3D).

The methods and processes implemented to form the tri-color LED device 100 disclosed herein in FIGS. 1-3 greatly simplify the fabrication steps of forming the LED structures of different colors. Since all three light emitting layers are formed together as a stacked structure by bonding, each light emitting layer of a particular color can be manufactured individually without introducing the complicated steps of multiple layers growing or depositing one by one on top of one another. In addition, all the layers formed can be shared across the different LED structures during the fabrication steps, and each LED structure of a particular color can therefore be formed from the same base layers with minimal patterning and etching steps. The methods and processes improve the efficiency of the fabrication in forming multi-color micro-LED devices, and also reduce the cost by reducing the intermediate steps and materials.

In some embodiments, in order to form the two-color LED device 200 as shown in FIG. 1B, the fabrication steps are substantially the same as forming the tri-color LED device, except that the steps of forming the light emitting layer 302, and its related metal bonding layer 301 and the substrate 305 are not needed.

Various design aspects of the multi-color LED device, such as the dimensions of the layers (e.g., width, length, height, and cross-sectional area of each layer), the dimension of the electrodes, size, shape, spacing, and arrangement of the two or more LED structures, the two or more light emitting layers, bonding layers, reflection layers and the conductive layers, and the configuration between the integrated circuits, pixel driver and electrical connections are selected (e.g., optimized using a cost or performance function) for obtaining the desired LED characteristics. LED characteristics that vary based on the above design aspects include, e.g., size, materials, cost, fabrication efficiency, light emission efficiency, power consumption, directivity, luminous intensity, luminous flux, color, spectrum and spatial radiation pattern.

Further embodiments also include various subsets of the above embodiments including embodiments in FIGS. 1A, 1B, 2, and 3A-3D combined or otherwise re-arranged in various embodiments.

Figure 4:
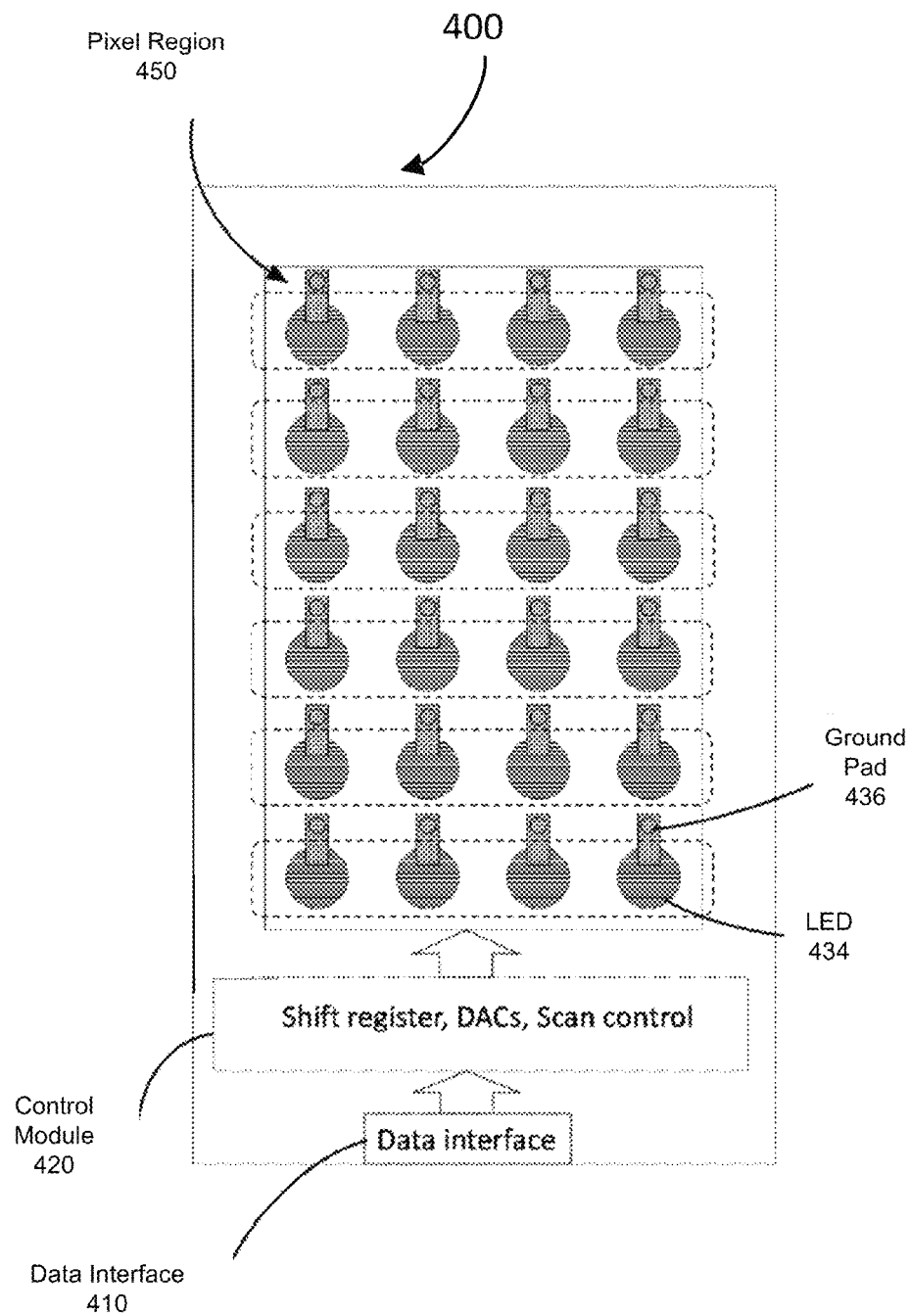
FIG. 4 is a top view of a micro LED display panel, in accordance with some embodiments.

FIG. 4 is a top view of a micro LED display panel 400, in accordance with some embodiments. The display panel 400 includes a data interface 410, a control module 420 and a pixel region 450. The data interface 410 receives data defining the image to be displayed. The source(s) and format of this data will vary depending on the application. The control module 420 receives the incoming data and converts it to a form suitable to drive the pixels in the display panel. The control module 420 may include digital logic and/or state machines to convert from the received format to one appropriate for the pixel region 450, shift registers or other types of buffers and memory to store and transfer the data, digital-to-analog converters and level shifters, and scan controllers including clocking circuitry.

The pixel region 450 includes an array of pixels. The pixels include micro LEDs, such as a tri-color LED 434, integrated with pixel drivers, for example as described above. In this example, the display panel 400 is a color RGB display panel. It includes red, green and blue pixels. Within each pixel, the tri-color LED 434 is controlled by a pixel driver. The pixel makes contact to a supply voltage (not shown) and ground via a ground pad 436, and also to a control signal, according to the embodiments shown previously. Although not shown in FIG. 4, the p-electrode of the tri-color LED 434 and the output of the driving transistor are positioned within the LED 434, and they are electrically connected through the metal bonding layer, such as the metal bonding layer 101 in FIGS. 1A and 1B. The LED current driving signal connection (between p-electrode of LED and output of the pixel driver), ground connection (between n-electrode and system ground), the supply voltage Vdd connection (between source of the pixel driver and system Vdd), and the control signal connection to the gate of the pixel driver are made in accordance with various embodiments.

FIG. 4 is merely a representative figure. Other designs will be apparent. For example, the colors do not have to be red, green and blue. They also do not have to be arranged in columns or stripes. As one example, apart from the arrangement of a square matrix of pixels shown in FIG. 4, an arrangement of hexagonal matrix of pixels can also be used to form the display panel 400.

In some applications, a fully programmable rectangular array of pixels is not necessary. Other designs of display panels with a variety of shapes and displays may also be formed using the device structures described herein. One class of examples is specialty applications, including signage and automotive. For example, multiple pixels may be arranged in the shape of a star or a spiral to form a display panel, and different patterns on the display panel can be produced by turning on and off the LEDs. Another specialty example is automobile headlights and smart lighting, where certain pixels are grouped together to form various illumination shapes and each group of LED pixels can be turned on or off or otherwise adjusted by individual pixel drivers.

Even the lateral arrangement of devices within each pixel can vary. In FIGS. 1A, 1B, and 3A-3D the LEDs and pixel drivers are arranged vertically, i.e., each LED is located on top of the corresponding pixel driver circuit. Other arrangements are possible. For example, the pixel drivers could also be located "behind", "in front of", or "beside" the LED.

Different types of display panels can be fabricated. For example, the resolution of a display panel can range typically from 8×8 to 3840×2160. Common display resolutions include QVGA with 320×240 resolution and an aspect ratio of 4:3, XGA with 1024×768 resolution and an aspect ratio of 4:3, D with 1280×720 resolution and an aspect ratio of 16:9, FHD with 1920×3020 resolution and an aspect ratio of 16:9, UHD with 3840×2160 resolution and an aspect ratio of 16:9, and 4K with 4096×2160 resolution. There can also be a wide variety of pixel sizes, ranging from sub-micron and below to 10 mm and above. The size of the overall display region can also vary widely, ranging from diagonals as small as tens of microns or less up to hundreds of inches or more.

Different applications will also have different requirements for optical brightness. Example applications include direct viewing display screens, light engines for home/office projectors and portable electronics such as smart phones, laptops, wearable electronics, AR and VR glasses, and retinal projections. The power consumption can vary from as low as a few milliwatts for retinal projectors to as high as kilowatts for large screen outdoor displays, projectors, and smart automobile headlights. In terms of frame rate, due to the fast response (nanoseconds) of inorganic LEDs, the frame rate can be as high as KHz, or even MHz for small resolutions.

Further embodiments also include various subsets of the above embodiments including embodiments in FIGS. 1A, 1B, 2, 3A-3D and 4 combined or otherwise re-arranged in various embodiments.

Although the detailed description contains many specifics, these should not be construed as limiting the scope of the invention but merely as illustrating different examples and aspects of the invention. It should be appreciated that the scope of the invention includes other embodiments not discussed in detail above. For example, the approaches described above can be applied to the integration of functional devices other than LEDs with control circuitry other than pixel drivers. Examples of non-LED devices include vertical cavity surface emitting lasers (VCSEL), photodetectors, micro-electro-mechanical system (MEMS), silicon photonic devices, power electronic devices, and distributed feedback lasers (DFB). Examples also include Organic LED (OLED) devices. Examples of other control circuitry include current drivers, voltage drivers, trans-impedance amplifiers, and logic circuits.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

Features of the present invention can be implemented in, using, or with the assistance of a computer program product, such as a storage medium (media) or computer readable storage medium (media) having instructions stored thereon/in which can be used to program a processing system to perform any of the features presented herein. The storage medium can include, but is not limited to, high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory optionally includes one or more storage devices remotely located from the CPU(s). Memory or alternatively the non-volatile memory device(s) within the memory, comprises a non-transitory computer readable storage medium.

Stored on any machine readable medium (media), features of the present invention can be incorporated in software and/or firmware for controlling the hardware of a processing system, and for enabling a processing system to interact with other mechanisms utilizing the results of the present invention. Such software or firmware may include, but is not limited to, application code, device drivers, operating systems, and execution environments/containers.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art to best utilize the invention and the various embodiments.

What is claimed is:

1. A multi-color light-emitting diode (LED) pixel device for a display panel, comprising:
   an IC substrate, the IC substrate defining a horizontal direction along a length of the IC substrate and a vertical direction along a height of the IC substrate;
   a first LED structure on top of the IC substrate along the vertical direction, comprising a first light emitting layer; and
   a second LED structure on top of the IC substrate along the vertical direction, comprising a second light emitting layer and a third light emitting layer on top of the second light emitting layer;
   wherein:
      the first LED structure and the second LED structure are arranged along the horizontal direction on top of the IC substrate, the first light emitting layer in the first LED structure and the second light emitting layer in the second LED structure being substantially aligned along the horizontal direction;
      the first LED structure is configured to generate a first color light emitted from the first light emitting layer;
      the second LED structure is configured to generate a second color light emitted by the third light emitting layer, and no light is emitted from the second light emitting layer;
      the first light emitting layer comprises a first semiconductor layer and a second semiconductor layer on top of the first semiconductor layer;
      the second light emitting layer comprises a third semiconductor layer and a fourth semiconductor layer on top of the third semiconductor layer;
      the third light emitting layer comprises a fifth semiconductor layer and a sixth semiconductor layer on top of the fifth semiconductor layer;
      each of the first semiconductor layer, the third semiconductor layer, and the sixth semiconductor layer comprises a first-type semiconductor;
      each of the second semiconductor layer, the fourth semiconductor layer, and the fifth semiconductor layer comprises a second-type semiconductor;
      in the first LED structure, the second semiconductor layer electrically connects to the IC substrate with a first electrode, a first end of the first electrode in direct contact with a top surface of the second semiconductor layer and a second end of the first electrode in direct contact with the IC substrate;
      in the second LED structure, the fifth semiconductor layer electrically connects to the IC substrate with a second electrode, a first end of the second electrode electrically connecting a bottom of the fifth semiconductor layer, a second end of the second electrode in direct contact with the IC substrate, and a sidewall of the second electrode contacting a sidewall of the second light emitting layer; and
      a top transparent conductive layer covers a top surface and a side surface of each of the first LED structure and the second LED structure, the top transparent conductive layer in direct contact with the first semiconductor layer in the first LED structure and a top surface of the sixth semiconductor layer in the second LED structure.

2. The multi-color LED pixel device according to claim 1, wherein:
   each of the first light emitting layer, the second light emitting layer, and the third light emitting layer comprises a respective PN junction; and
   the first-type semiconductor is a P-type semiconductor and the second-type semiconductor is a N-type semiconductor, or the first-type semiconductor is a N-type semiconductor and the second-type semiconductor is a P-type semiconductor.

3. The multi-color LED pixel device according to claim 1, wherein:
   the first light emitting layer in the first LED structure and the second light emitting layer in the second LED structure are formed in a same manufacturing step.

4. The multi-color LED pixel device according to claim 1, wherein an insulation layer is formed between the top transparent conductive layer and each of the top surface and the side surface of each of the first LED structure and the second LED structure.

5. The multi-color LED pixel device according to claim 4, wherein:
   in the first LED structure, the first semiconductor layer has a protrusion that extends along the horizontal direction outside the second semiconductor layer,
   an opening is formed in a portion of the insulation layer that covers the protrusion, and the top transparent conductive layer is deposited in the opening on the protrusion.

6. The multi-color LED pixel device according to claim 1, wherein:
   a first bonding layer is formed between the IC substrate and the first light emitting layer and between the IC substrate and the second light emitting layer; and
   a second bonding layer is formed between the second light emitting layer and the third light emitting layer.

7. The multi-color LED pixel device according to claim 6, wherein a dielectric layer is formed between the first bonding layer and the first light emitting layer and between the first bonding layer and the second light emitting layer.

8. The multi-color LED pixel device according to claim 6, wherein, in the second LED structure, the second electrode electrically contacts the first bonding layer and the second bonding layer.

9. A multi-color LED pixel device for a display panel, comprising:
- an IC substrate, the IC substrate defining a horizontal direction along a length of the IC substrate and a vertical direction along a height of the IC substrate;
- a first LED structure on top of the IC substrate along the vertical direction, comprising a first light emitting layer;
- a second LED structure on top of the IC substrate along the vertical direction, comprising a second light emitting layer and a third light emitting layer on top of the second light emitting layer; and
- a third LED structure on top of the IC substrate along the vertical direction, comprising a fourth light emitting layer, a fifth light emitting layer on top of the fourth light emitting layer, and a sixth light emitting layer on top of the fifth light emitting layer, wherein:
- the first LED structure, the second LED structure, and the third LED structure are arranged along the horizontal direction on top of the IC substrate, the first light emitting layer in the first LED structure, the second light emitting layer in the second LED structure, and the fourth light emitting layer in the third LED structure being substantially aligned along the horizontal direction, and the third light emitting layer in the second LED structure and the fifth light emitting layer in the third LED structure being substantially aligned along the horizontal direction;
- the first LED structure is configured to generate a first color light emitted from the first light emitting layer;
- the second LED structure is configured to generate a second color light emitted by the third light emitting layer, and no light is emitted from the second light emitting layer;
- the third LED structure is configured to generate a third color light emitted by the sixth light emitting layer, and no light is emitted from the fourth light emitting layer and the fifth light emitting layer;
- the first light emitting layer comprises a first semiconductor layer and a second semiconductor layer on top of the first semiconductor layer;
- the second light emitting layer comprises a third semiconductor layer and a fourth semiconductor layer on top of the third semiconductor layer;
- the third light emitting layer comprises a fifth semiconductor layer and a sixth semiconductor layer on top of the fifth semiconductor layer;
- the fourth light emitting layer comprises a seventh semiconductor layer and an eighth semiconductor layer on top of the seventh semiconductor layer;
- the fifth light emitting layer comprises a ninth semiconductor layer and a tenth semiconductor layer on top of the ninth semiconductor layer;
- the sixth light emitting layer comprises an eleventh semiconductor layer and a twelfth semiconductor layer on top of the eleventh semiconductor layer;
- each of the first semiconductor layer, the third semiconductor layer, the sixth semiconductor layer, the seventh semiconductor layer, the tenth semiconductor layer, and the twelfth semiconductor layer comprises a first-type semiconductor;
- each of the second semiconductor layer, the fourth semiconductor layer, the fifth semiconductor layer, the eighth semiconductor layer, the ninth semiconductor layer, and the eleventh semiconductor layer comprises a second-type semiconductor;
- in the first LED structure, the second semiconductor layer electrically connects to the IC substrate with a first electrode;
- in the second LED structure, the fifth semiconductor layer electrically connects to the IC substrate with a second electrode;
- in the third LED structure, the eleventh semiconductor layer electrically connects to the IC substrate with a third electrode, a first end of the third electrode electrically connecting a bottom of the eleventh semiconductor layer, a second end of the third electrode in direct contact with the IC substrate, and a sidewall of the third electrode contacting a sidewall of each of the fourth light emitting layer and the fifth light emitting layer; and
- a top transparent conductive layer covers a top surface and a side surface of each of the first LED structure, the second LED structure, and the third LED structure, the top transparent conductive layer in direct contact with the first semiconductor layer in the first LED structure, the sixth semiconductor layer in the second LED structure, and the top surface of the twelfth semiconductor layer in the third LED structure.

10. The multi-color LED pixel device according to claim 9, wherein:
- each of the first light emitting layer, the second light emitting layer, the third light emitting layer, the fourth light emitting layer, the fifth light emitting layer, and the sixth light emitting layer comprises a respective PN junction; and
- the first-type semiconductor is a P-type semiconductor and the second-type semiconductor is a N-type semiconductor, or the first-type semiconductor is a N-type semiconductor and the second-type semiconductor is a P-type semiconductor.

11. The multi-color LED pixel device according to claim 9, wherein:
- the first light emitting layer in the first LED structure, the second light emitting layer in the second LED structure, and the fourth light emitting layer in the third LED structure are formed in a first same manufacturing step; and
- the third light emitting layer in the second LED structure and the fifth light emitting layer in the third LED structure are formed in a second same manufacturing step.

12. The multi-color LED pixel device according to claim 9, wherein:
- a first bonding layer is formed between the IC substrate and the first light emitting layer, between the IC substrate and the second light emitting layer, and between the IC substrate and the fourth light emitting layer;
- a second bonding layer is formed between the second light emitting layer and the third light emitting layer and between the fourth light emitting layer and the fifth light emitting layer; and
- a third bonding layer is formed between the fifth light emitting layer and the sixth light emitting layer.

13. The multi-color LED pixel device according to claim 12, wherein:

in the second LED structure, the second electrode electrically contacts the first bonding layer and the second bonding layer; and in the third LED structure, the third electrode electrically contacts the first bonding layer, the second bonding layer, and the third bonding layer.

* * * * *